United States Patent [19]
Irrinki et al.

[11] Patent Number: 5,808,932
[45] Date of Patent: Sep. 15, 1998

[54] MEMORY SYSTEM WHICH ENABLES STORAGE AND RETRIEVAL OF MORE THAN TWO STATES IN A MEMORY CELL

[75] Inventors: V. Swamy Irrinki, Milpitas; Ashok Kapoor; Raymond T. Leung, both of Palo Alto; Alex Owens, Los Gatos; Thomas R. Wik, Livermore, all of Calif.

[73] Assignee: LSI Logic Corporation, Milpitas, Calif.

[21] Appl. No.: 779,991

[22] Filed: Dec. 23, 1996

[51] Int. Cl.$^6$ ............................. G11C 11/24; G11C 11/56
[52] U.S. Cl. ......................... 365/150; 365/168; 365/187
[58] Field of Search ................. 365/150, 168, 365/187, 222

[56] References Cited

U.S. PATENT DOCUMENTS

| | | | |
|---|---|---|---|
| 4,057,788 | 11/1977 | Sage | 365/174 |
| 4,633,438 | 12/1986 | Kume et al. | 365/51 |
| 4,661,929 | 4/1987 | Aoki et al. | 365/149 |
| 4,715,014 | 12/1987 | Tuvell et al. | 365/185 |
| 4,910,709 | 3/1990 | Dhong et al. | 365/149 |
| 4,935,896 | 6/1990 | Matsumura et al. | 365/187 |
| 5,021,999 | 6/1991 | Kohda et al. | 365/168 |
| 5,119,330 | 6/1992 | Tanagawa | 365/168 |
| 5,159,570 | 10/1992 | Mitchell et al. | 365/185 |
| 5,172,338 | 12/1992 | Mehrotra et al. | 365/185 |
| 5,262,988 | 11/1993 | Ochii | 365/150 X |
| 5,282,162 | 1/1994 | Ochii | 365/189.01 |
| 5,283,761 | 2/1994 | Gillingham | 365/189.07 |
| 5,351,210 | 9/1994 | Saito | 365/189.01 |
| 5,357,464 | 10/1994 | Shukuri et al. | 365/185 |
| 5,394,362 | 2/1995 | Banks | 365/189.01 |
| 5,459,686 | 10/1995 | Saito | 365/149 |
| 5,521,865 | 5/1996 | Ohuchi et al. | 365/185.22 |
| 5,532,955 | 7/1996 | Gillingham | 365/149 |
| 5,646,903 | 7/1997 | Johnson | 365/187 X |

OTHER PUBLICATIONS

Abbott, et al., "A 4K MOS Dynamic Random–Access Memory," IEEE Journal of Solid–State Circuits, vol. SC–8, No. 5, Oct. 1973, pp. 292–298.

*Primary Examiner*—David C. Nelms
*Assistant Examiner*—Son Mai
*Attorney, Agent, or Firm*—Conely, Rose & Tayon; B. Noel Kivlin

[57] ABSTRACT

A memory circuit which enables storage of more than two logic states in a memory cell. Since the additional logic states may be used to represent additional information bits, this memory circuit increases the number of bits that may be stored per memory cell, thereby increasing the storage density and reducing the cost per bit. The disclosed memory circuit comprises an analog-to-digital converter coupled to detect a current through a transistor in a memory cell. The current is determined by a charge stored on the transistor's gate. By enabling the current to be detected in discrete increments, it becomes possible to represent more than one bit of information with the charge stored in the memory cell. Usage of additional increments necessitates more precise storage and detection circuitry. In one embodiment, the storage circuitry uses feedback to obtain a greater logic state retrieval accuracy.

18 Claims, 6 Drawing Sheets

MEMORY SYSTEM WHICH ENABLES STORAGE AND RETRIEVAL OF MORE THAN TWO STATES IN A MEMORY CELL

BACKGROUND OF THE INVENTION

1. Field of the Invention

This invention relates to the field of solid state devices for information storage, and in particular to a method and structure for storing multilevel logic values in a dynamic random access memory (DRAM).

2. Description of the Related Art

Memory devices store and retrieve large quantities of digital data at electronic speeds. Early digital computers used magnetic cores as the devices in fast-access memories. With the introduction of semiconductor memory chips in the late 1960s, magnetic cores began to be replaced by integrated circuits which implement a much higher-density memory function. This not only increased the performance capabilities of the memory, but also drastically decreased its cost. By the end of the 1970s, magnetic core memories had been completely displaced as high-speed memory devices.

Memory capacities in digital systems are commonly expressed in terms of bits (binary digits), since a separate device or circuit is used to store each bit of data. Each storage element is referred to as a cell. Memory capacities are also sometimes stated in terms of bytes (8 or 9 bits) or words (arbitrarily defined, but commonly 16–80 bits). Every bit, byte, or word is stored in a particular location, identified by a unique numeric address. Only a single bit, byte, or word is stored or retrieved during each cycle of memory operation.

The units of memory storage capacity are typically kilobits and megabits (or kilobytes and megabytes). Since memory addressing is based on binary codes, capacities that are integral powers of 2 are typically used. As a result, a memory device with a 1-kbit capacity can actually store 1024 bits, and a 64-kbyte device can store 65,536 bytes.

In digital computers, the number of memory bits is usually 100 to 1000 times greater than the number of logic gates, which implies that the memory cost per bit must be kept very low. In addition, it is desirable for the memory devices to be as small as possible (since this will allow the highest density of cells on a chip), to operate at a high speed, to have a small power consumption, and to operate reliably. To achieve this end, memory cells are designed to be as simple and compact as possible. Typically, the cell itself is not capable of outputting digital data in an electrical form compatible with the requirements of the remainder of the system. To restore the electrical characteristics of the cell's outputted data to adequate values, properly designed peripheral circuits (e.g. sense amplifiers, memory registers, and output drivers) are necessary. These circuits are designed to be shared by many memory cells. The trade-off thus made is that of a less robust output signal from the cell, in exchange for a simple, compact memory cell design.

The most flexible digital memories are those that allow for data storage (hereafter, writing) as well as data retrieval (hereafter, reading). Memories in which both of these functions can be rapidly and easily performed, and whose cells can be accessed in random order (independent of their physical locations), are referred to as random-access memories (RAMs). Read-only memories (ROMs) are those in which only the read operation can be performed rapidly. Entering data into a ROM is referred to as programming the ROM. This operation is much slower than the writing operation used in RAMs.

The storage cells in a typical semiconductor memory are arranged in an array consisting of horizontal rows and vertical columns. Each cell shares electrical connections with all the other cells in its row, and column. The horizontal lines connected to all the cells in the row are called word lines, and the vertical lines (along which data flows into and out of the cells) are referred to as data lines. Each cell therefore has a unique memory location, or address, which can be accessed at random through the selection of the appropriate word and data line. Some memories are designed so that all the cells in a row are accessed simultaneously. This array configuration of semiconductor memories lends itself well to the regular structured designs which are favored in VLSI.

There are a number of important circuits on the periphery of the array. One such peripheral circuit is the address decoder. This circuit allows a large number of word and data lines to be accessed with the fewest number of address lines. Address decoders for this purpose have $2^n$ output lines, with a different one selected for each different n-bit input code. In later generations of memory circuits, address multiplexing was integrated on some memory chips to reduce the number of address pins by half.

Another peripheral circuit is the read/write control circuitry. This circuitry determines whether data is to be written into or read from the memory. Because such circuits also amplify and buffer the data signals retrieved from the cells, one of the important circuits in this subsystem is the sense amplifier. In dynamic memories that need periodic data refreshing, refresh circuitry may also be provided.

Recently, additional peripheral circuits have been added to the basic memory organization structure. These circuits serve mainly to improve the manufacturability and testability of the chips. Those designed to increase manufacturability include redundancy circuits and error-correction circuits. Redundancy circuits allow some defective chips to be salvaged, while self-testing circuits reduce testing time. Error-detection and correction techniques involve the addition of parity bits to allow the system to detect bad data, accomplish parity checking, and in some cases provide correction of the data errors.

Most RAMs have only one input-data lead and one output-data lead (or a single combined input/output lead). Writing into and reading from such RAMs is done one bit at a time. Other RAMs have a number of input- and output-data leads, with the number determined by the word length of the system's data bus. ROMs, on the other hand, are typically organized so that the number of output-data leads is the same as the number of lines on the data bus. ROMs are programmed word by word and are read from in the same manner.

In semiconductor RAMs, information is stored on each cell either through the charging of a capacitor or the setting of the state of a bi-stable flip-flop circuit. With either method, the information on the cell is destroyed if the power is interrupted. Such memories are therefore referred to as volatile memories. When the charge on a capacitor is used to store data in a semiconductor-RAM cell, the charge needs to be periodically refreshed, since leakage currents will remove it in a few milliseconds. Hence, volatile memories based on this storage mechanism are known as dynamic RAMs, or DRAMs.

If the data is stored (written) by setting the state of a flip-flop, it will be retained as long as power is connected to the cell (and flip-flop is not reset by another write signal). RAMs fabricated with such cells are known as static RAMs, or SRAMs. Volatile RAMs can be treated as non-volatile if they are provided with a battery backup. Some DRAM and SRAM chips are even packaged together with a battery to facilitate implementation of this approach.

It is often desirable to use memory devices that will retain information even when the power is interrupted. Magnetic media offer such nonvolatile-memory storage. In addition, a variety of semiconductor memories have been developed with this characteristic. At present, virtually all such nonvolatile memories are ROMs. While data can be entered into these memories, the programming procedure varies from one type of ROM to the other.

The first group of nonvolatile memories consists of those ROMs in which data is entered during manufacturing, and cannot be subsequently altered by the user. These devices are known as masked ROMs (or simply ROMs). The next category consists of memories whose data can be entered by the user (user-programmable ROMs). In the first example of this type, known as a programmable ROM, or PROM, data can be entered into the device only once. In the remaining ROM types, data can be erased as well as entered. In one class of erasable ROMs, the cells must be exposed to a strong ultraviolet light in order for the data to be erased. These ROMs are called erasable-programmable ROMs, or EPROMs. In the final type, data can be electrically erased as well as entered into the device; these are referred to as EEPROMs. The time needed to enter data into both EPROMs and EEPROMs is much longer than the time required for the write operation in a RAM. As a result, none of the ROM types can at present be classified as fully functional RAM devices.

Many variations on the basic memory organization architecture have been developed, including video RAMs and multiport RAMs. Architectures which combine memory and logic circuits on the same chip are becoming increasingly popular. But the primary trends in semiconductor memory development are to increase the storage density and to reduce the cost per bit. It would therefore be desirable to have a method and structure for further increasing the bit storage density and reducing the cost per bit.

SUMMARY OF THE INVENTION

The problems outlined above are in large part solved by a memory circuit which enables storage and retrieval of more than two logic states in a memory cell. In one embodiment, a storage transistor has a gate connected to a write transistor. When the write transistor is enabled, it is possible to store a charge quantity indicative of one of three or more logic states. A read transistor is connected to the channel of the storage transistor, and when the read transistor is enabled, the current which flows through the storage transistor is indicative of the stored charge quantity. An analog-to-digital (A/D) converter is coupled to the read transistor so as to sense the current and determine the state represented by the stored charge quantity. Since the additional logic states may be used to represent additional information bits, this memory circuit increases the number of bits that may be stored per memory cell, thereby increasing the storage density and reducing the cost per bit.

Broadly speaking, the present invention contemplates a memory circuit comprising a memory cell and an analog-to-digital converter. The memory cell includes a storage transistor with a gate coupled to a write transistor, a first terminal coupled to a known voltage, and a second terminal coupled to a read transistor. The write transistor is configured to store a charge on the gate of the storage transistor when a write signal is asserted. The read transistor is configured to conduct a current through the storage transistor when a read signal is asserted. The analog-to-digital converter is coupled to detect the current that passes through the storage transistor and convert the value of the current to one of at least three digital values.

BRIEF DESCRIPTION OF THE DRAWINGS

Other objects and advantages of the invention will become apparent upon reading the following detailed description and upon reference to the accompanying drawings in which.

Figure 1:
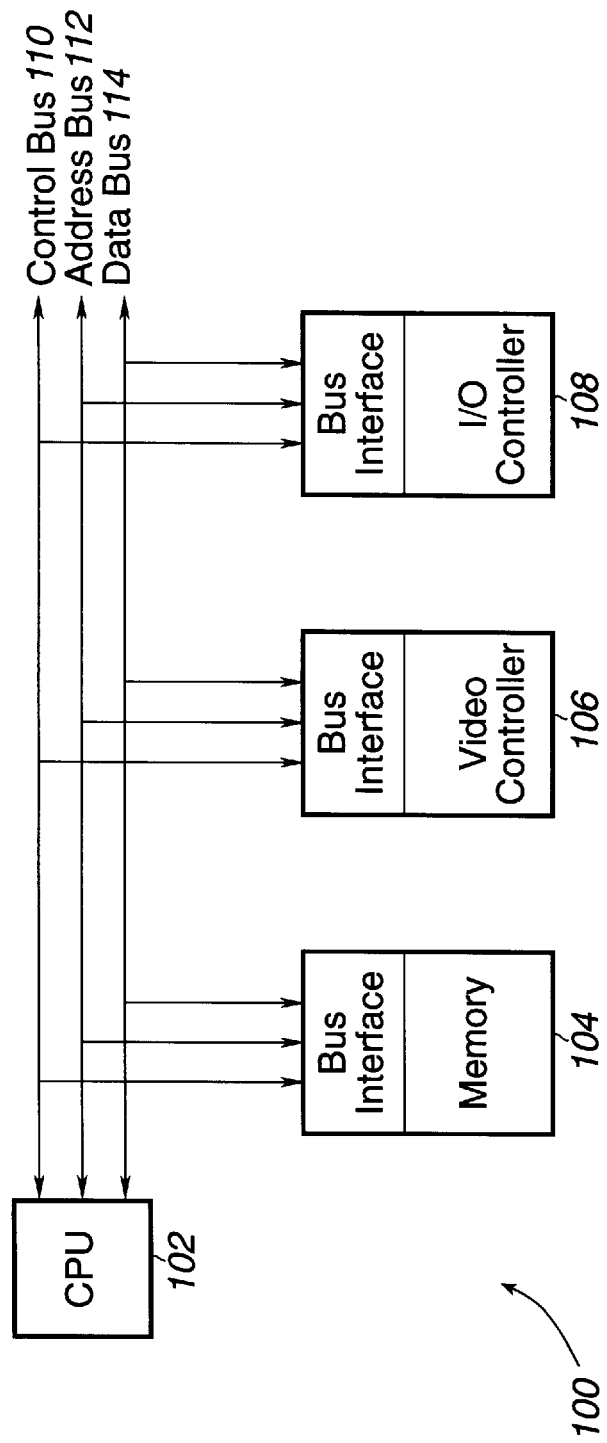
FIG. 1 is a signal flow diagram illustrating a computer system having memory and a CPU which communicate via a control bus, an address bus, and a data bus.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to FIG. 1, a computer system 100 is shown having a CPU 102 coupled to three peripherals: a memory 104, a video controller 106, and an I/O controller 108. One or more bus bridge units (not shown) may be interposed between CPU 102 and the peripherals. Memory 104, video controller 106, and I/O controller 108 each include a bus interface. As will be described further below, memory 104 includes memory cells capable of storing more than two logic states and read/write circuitry for storage and retrieval of these multiple logic states.

The architecture of computer system 100 allows CPU 102 to read from and write to peripherals via data bus 114. Address bus 112 is used to indicate which device and data address CPU 102 wishes to access, and control bus 110 provides additional signaling lines which are used to indicate the type of access desired and to provide timing information.

Figure 2:
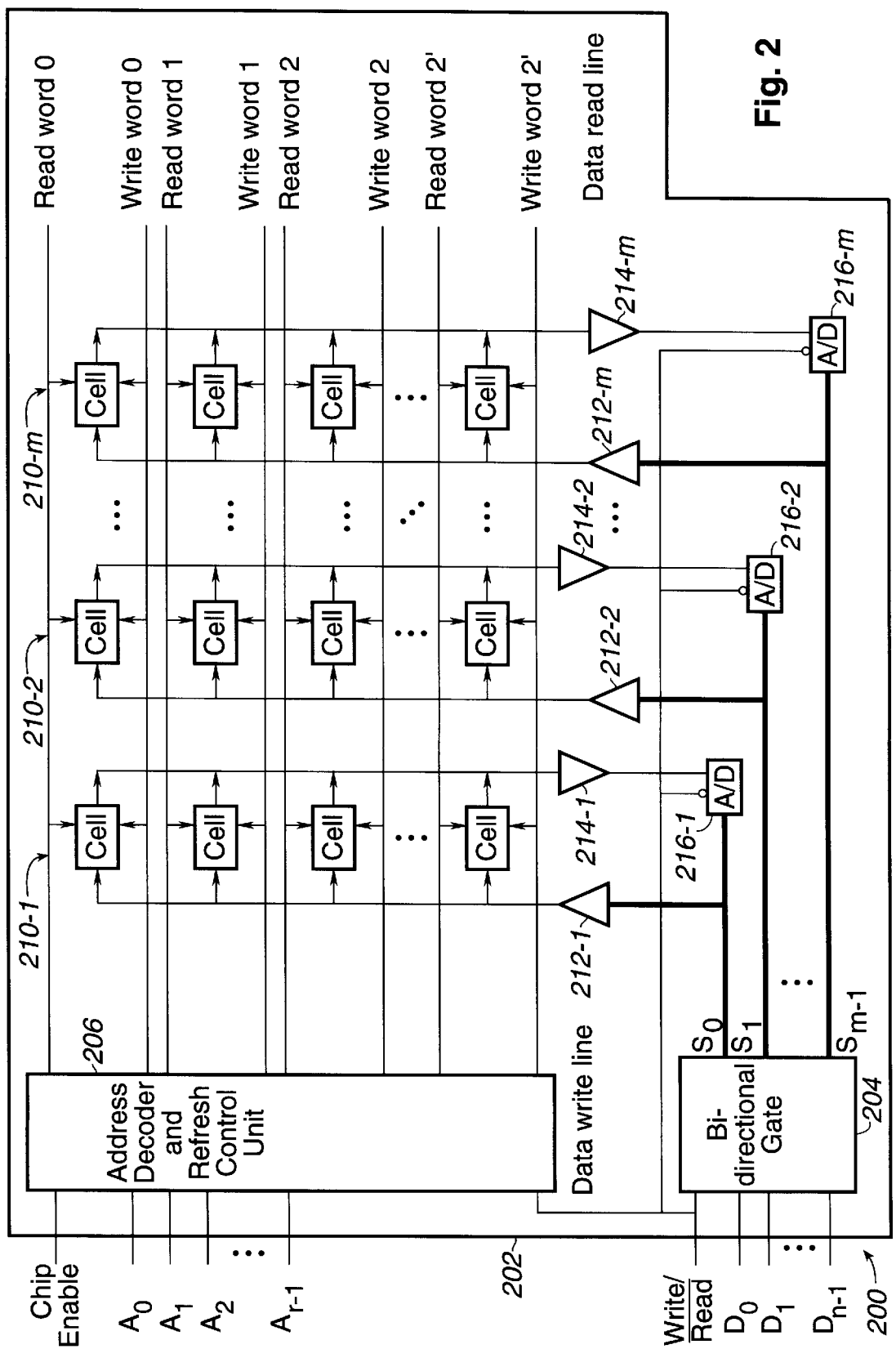
FIG. 2 is a block diagram of a first semiconductor memory architecture capable of storing multiple level logic states according to the present invention.

FIG. 2 shows an exemplary memory architecture employed within computer system 100. In this embodiment, memory 200 has a ground plane 202 surrounding the chip circuitry which shields the circuitry from electromagnetic noise. Memory 200 receives a chip enable signal, a read/ write signal, and r address bit signals at an address decoder and refresh unit 206. During operation when the chip enable signal is asserted with the read/write signal indicating a read, address decoder and refresh unit 206 asserts one of $2^r$ read word lines. Each of the read word lines is coupled to a row of memory cells. Each row of memory cells is also coupled by a write word line to address controller 206. When a read word line is asserted, the corresponding row of memory cells may be read. Similarly, when a write word line is asserted, the corresponding row of memory cells may be written.

Memory 200 also has n bi-directional binary data lines ($D_0$–$D_{n-1}$) connected to a bi-directional gate 204. Bi-directional gate 204 is coupled to receive the read/write signal and is further coupled to m data paths which carry multi-value logic signals ($S_0$–$S_{m-1}$). Each of the data paths can be driven by either bi-directional gate 204 or one of a set of analog-to-digital (A/D) converters 216-1 through 216-m (referred to collectively as A/D converters 216). Each of the data paths provides input to one of a set of data line drivers 212-1 through 212-m (referred to collectively as data line drivers 212). Data line drivers 212 each serve to convert the multi-value logic signal into a multi-level voltage signal which is coupled by a data write line to a corresponding column of memory cells. Each column of memory cells is also coupled by a data read line to one of a set of sense amplifiers 214-1 through 214-m, which in turn provides input to one of the A/D converters 216.

An exemplary memory read operation is now described. Consider a situation in which the address bits are all zero, the write/read control line indicates a read operation, and the chip enable signal is asserted. Upon occurrence of this situation, address decoder and refresh unit 206 asserts the read word line for word 0 (i.e. "Read word 0"). This causes cells 210-1 through 210-m to pass a multi-level data signal indicative of information stored in the corresponding cells to the read data lines which are coupled to sense amplifiers 214. Sense amplifiers 214 detect and amplify the multi-level data signals and pass the amplified signals to A/D converters 216. A/D converters 216 convert the amplified signals to m multi-value logic signals ($S_0$–$S_{m-1}$) which are coupled to bi-directional gate 204. Bi-directional gate 204 converts the m multi-value logic signal ($S_0$–$S_{m-1}$) to n binary digital signals, and drives the n bits on data lines $D_0$–$D_{n-1}$. In this manner, a multi-value logic state stored in each cell may be read.

In one specific implementation, the cells being read are refreshed concurrent with the read operation. For the implementation of FIG. 2, data drivers 212 convert the m multi-value logic signals ($S_0$–$S_{m-1}$) into m multi-level voltage signals and drive them on the data write lines which are coupled to cells 210. If at this time the word write line for word 0 is asserted, cells 210 store the m multi-level voltage signals. In this way, the content of cells 210 can be refreshed every time they are read.

The effectuation of memory write operations is similar. For example, if the address bits are all zero and the write/read control line indicates a write operation when the chip enable signal is asserted, then address decoder and refresh unit 206 asserts the write word line for word 0. Bi-directional gate 204 receives data from the bi-directional binary data lines $D_0$–$D_{n-1}$ and converts the data into m multi-value logic signals which are driven onto the m data paths. The A/D converters 216 for driving each of the m data paths are disabled while the write/read control line indicates a write operation. Data line drivers 212 convert the input m multi-value logic signals into m multi-level voltage signals and drives the data write lines coupled to the selected cells 210. Having the word write line asserted causes the multi-level signal to be stored in cells 210.

Address decoder and refresh unit 206 further includes refresh circuitry to read and refresh the contents of each memory cell within a given time interval. The refresh cycles can be implemented in many ways, one of which is to have them happening continuously while the chip is not enabled. In this implementation method, bi-directional gate 204 is disabled and the A/D converters 216 are enabled during refresh cycles. Address decoder and refresh unit 206 may employ a counter which sequentially asserts each word line, causing a read operation similar to that described previously. In order to assure that each memory cell is refreshed, the chip must spend a specified fraction of a given time interval in the disabled mode.

Figure 3:
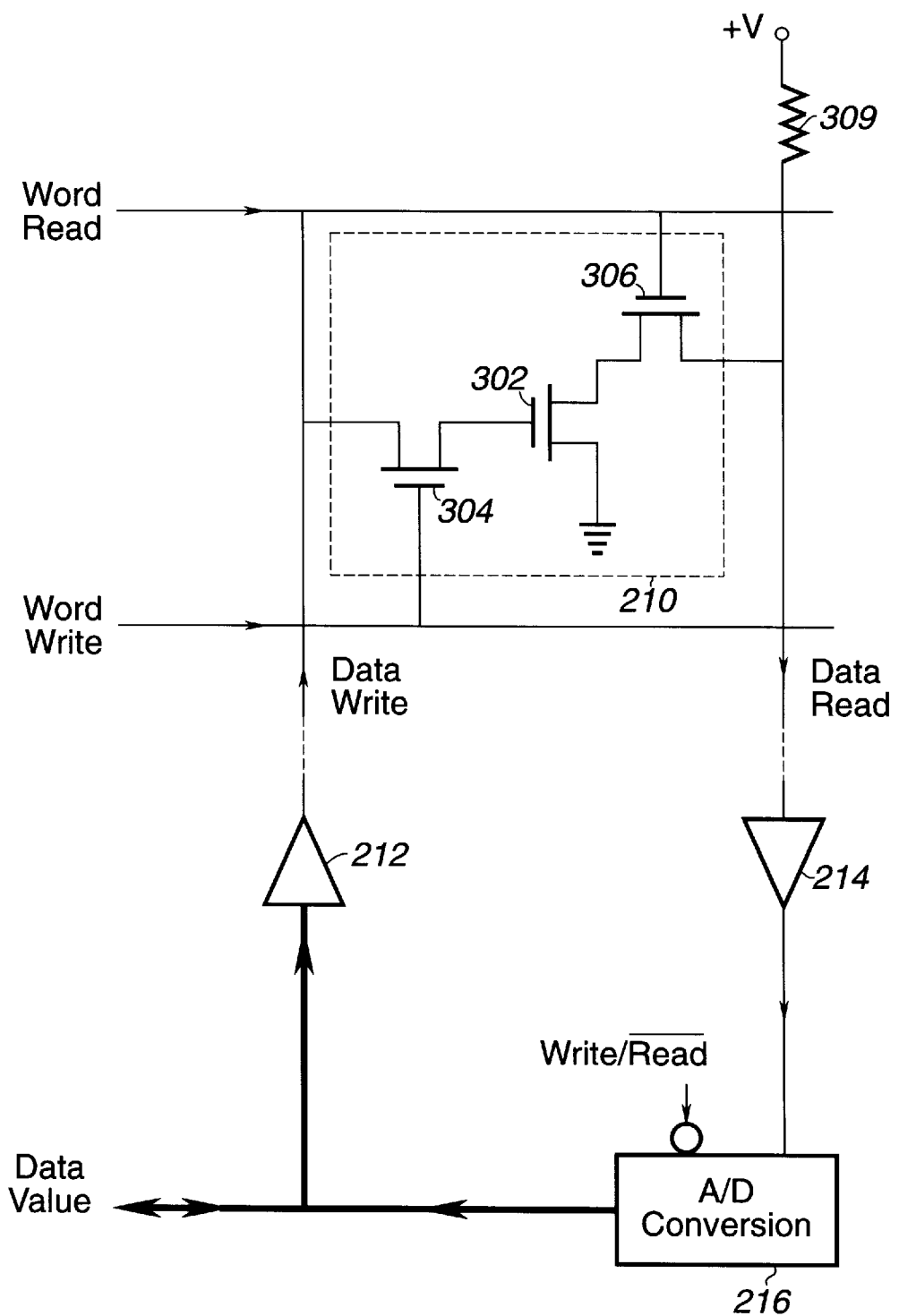
FIG. 3 is a block diagram illustrating the function of a memory cell and a first embodiment of the read/write circuitry.

Turning now to FIG. 3, portions of memory circuit 200 are shown in greater detail. Circuit portions that correspond to those of FIG. 2 are numbered identically for simplicity and clarity. FIG. 3 illustrates a memory cell 210 which is exemplary of each of the cells of FIG. 2. Memory cell 210 includes a storage transistor 302, a write transistor 304, and a read transistor 306. The gate of storage transistor 302 is coupled via write transistor 304 to the data write line. Write transistor 304 provides an electrically conductive path when the word write line is asserted, and an open circuit when the word line is de-asserted. Since the gate of storage transistor 302 has a significant capacitance, an electric charge can be stored on the gate by turning write transistor 304 on, passing a current through write transistor 304 to the gate of storage capacitor 302, and subsequently turning write transistor 304 off. The charge stored on the gate alters the conductivity of the channel of storage transistor 302. One terminal of storage transistor 302 is connected to ground, and the other terminal is connected to read transistor 306. Read transistor 306 provides an electrically conductive path when the word read line is asserted. The conductivity of storage transistor 302 can then be detected using the data read line. A pull-up resistance 309 which may be implemented with a pull-up transistor, effects a voltage on the data read line which is indicative of the charge stored on the gate of storage transistor 302. Sense amplifier 214 buffers and amplifies this voltage for A/D converter 214. A/D converter 216 is enabled when the write/read signal indicates a read operation, and disabled when a write operation is indicated. When enabled, A/D converter 216 converts the amplified signal into a multi-value logic signal which is one of $S_0$–$S_{m-1}$. Data line driver 212 converts the multi-value logic signal into a multi-level voltage on the data write line.

Figure 4:
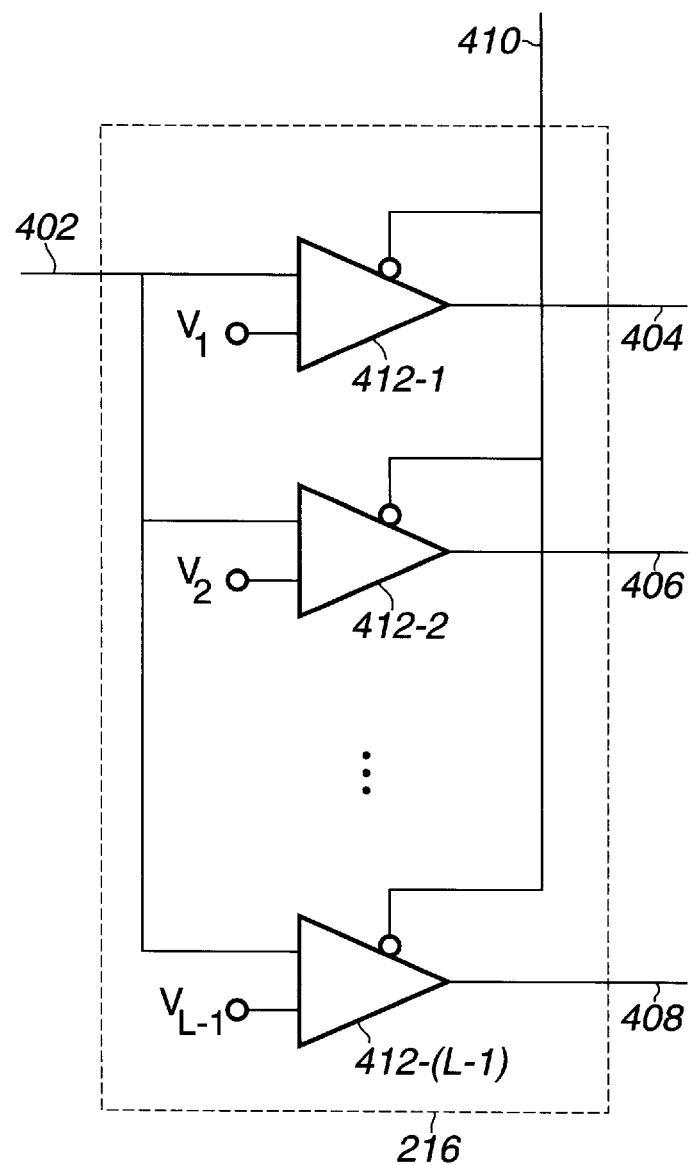
FIG. 4 is a block diagram of an analog to digital converter capable of sensing more than two stored signal states and converting them to digital form.

FIG. 4 shows a block diagram of one embodiment of A/D converter 216. A/D converter 216 receives an input signal 402 and drives a digital output signal on L-1 output lines 404–408 (which form a data path to carry one of the multi-value logic signals $S_0$–$S_{m-1}$) when enabled by a write/read signal 410. During operation, asserting write/read signal 410 drives the output lines to a high impedance state. A/D converter 400 is comprised of L- 1 comparators 412, where L is the number of logic states which can be stored in a memory cell 308. Each comparator receives one of L-1 reference voltages which demarcate the voltage regions representative of each logic state. For example, comparator 412-1 compares input signal 402 to reference voltage $V_1$, and (if enabled) asserts output line 404 when input signal 402 exceeds the reference voltage. The L- 1 output lines accordingly have L possible states, ranging from having no lines asserted to having L-1 lines asserted.

Turning back to FIG. 2, with continued reference to FIG. 4, in one exemplary configuration of memory 200 wherein each memory cell stores one of four discrete states, bi-directional gate 204 converts the input received at eight binary data lines $D_0$–$D_7$ to four quaternary logic signals $S_0$–$s_3$. Each of the logic signals is converted to a corresponding voltage on a data write line by a data line driver 212. The voltage at each data write line results in one of four charge quantities to be stored on the gate of the corresponding storage transistor 302 being written. When read, the charge stored on each storage transistor 302 results in one of four possible channel conductivities which induces one of four possible voltages at the outputs of the sense amplifiers 214. For example, the possible output voltages may be 0, V/3, 2V/3, and V, where V is the supply voltage. A/D converters 216 each include three output lines and three reference voltages which may be V/6, V/2, and 5V/6. Thus, if the output voltage of a particular cell 210 sensed by a sense amplifier 214 is 2V/3, two of the three output lines are asserted by A/D converter 216 (when enabled).

Figure 5:
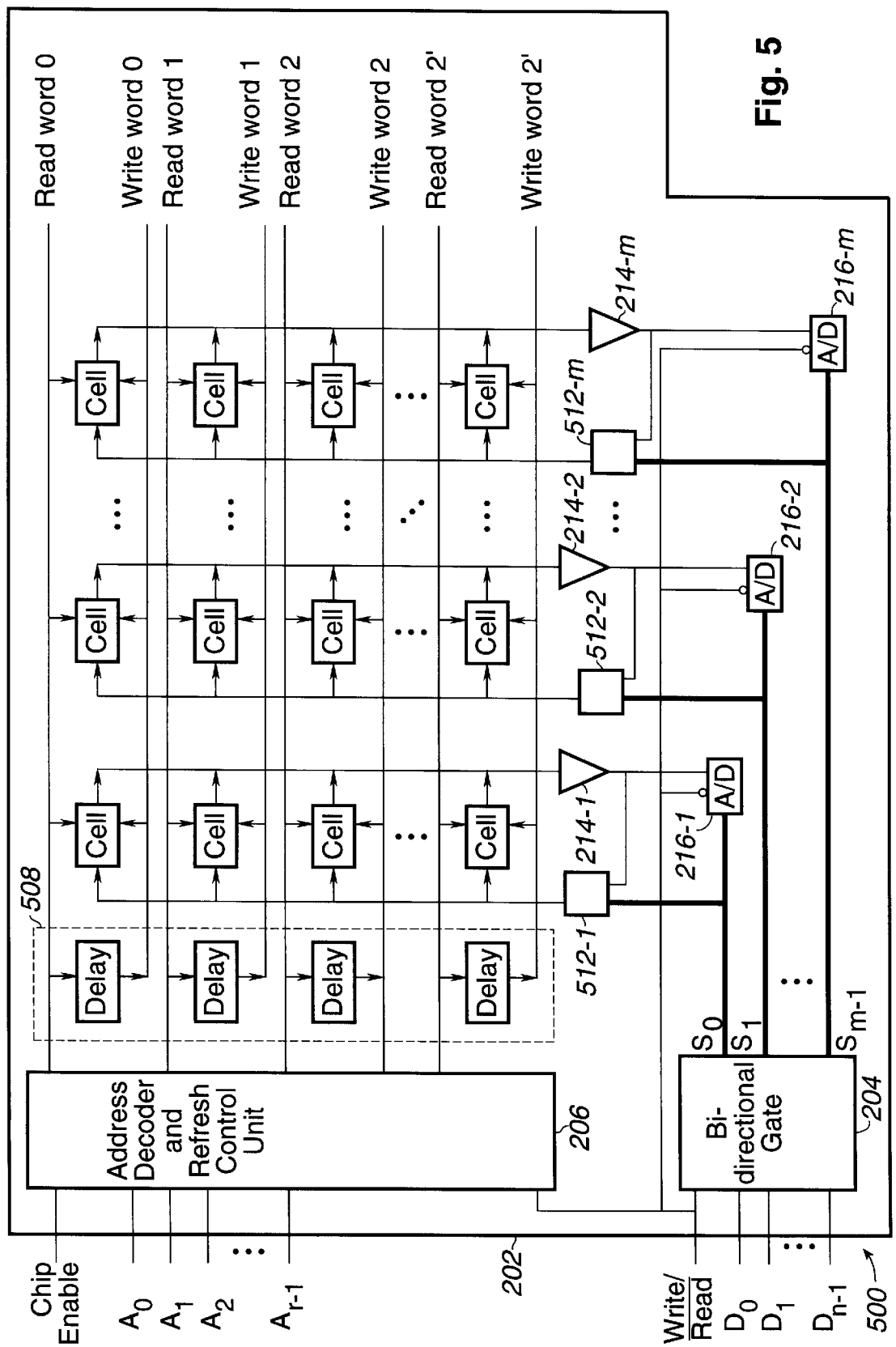
FIG. 5 is a block diagram of a second semiconductor memory architecture capable of storing multiple level logic states according to the present invention.

FIG. 5 shows a second exemplary memory architecture employed within computer system 100. Circuit portions that correspond to those of FIG. 2 are numbered identically. Memory 500 is similar to memory 200; however, in memory 500 a set of delay elements 508 is coupled between the read word lines and the write word lines. A set of data level controllers 512, which implement the functionality of data drivers 212, is used to write to memory cells. Additional functionality of data level controllers 512 is described further below. A feedback path between sense amplifiers 214 and data level controllers 512 is also shown in FIG. 5, and is discussed further below.

Delay elements 508 are configured to momentarily assert a write word line upon a preset delay following the assertion of a corresponding read word line. In this implementation, the read word line remains asserted until after the write word line assertion is terminated. Configuring delay elements 508 in this manner causes every memory access to comprise a read followed by a write. When the desired memory access is a read operation, the following write operation merely refreshes the cell contents. When the desired memory access is a write operation, the cell contents are replaced with new values. In both cases, the write operation is accomplished in accordance with respective outputs from data level controllers 512 while the cells' contents are detected by sense amplifiers 214.

Figure 6:
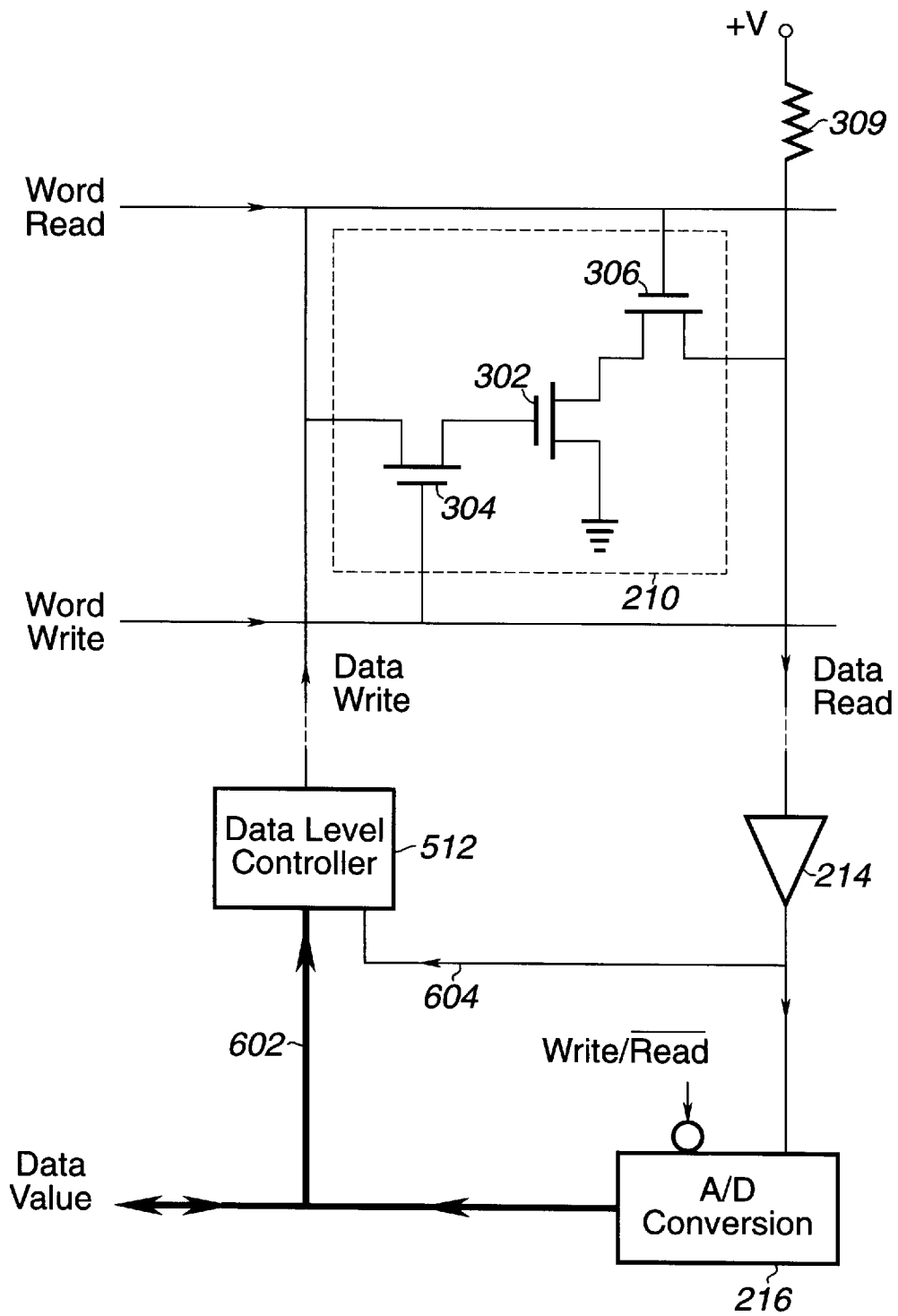
FIG. 6 is a block diagram illustrating the function of a memory cell and a second embodiment of the read/write circuitry.

Turning now to FIG. 6, aspects of memory 500 are shown in greater detail. Data level controller 512 is configured to accept a multi-value logic signal input 602 as a set point (i.e. an indicator of a desired voltage level at node 604). Data level controller 512 then provides a voltage signal on the data write line, and adjusts it until the output signal from sense amplifier 214 is equal to the desired voltage level which corresponds to the multi-value logic input signal 602. For example, if the defined values of the multi-value logic signal are 0, 1, 2, and 3 (in a four-level logic system), the voltage levels which might be chosen to correspond to these values are 0, V/3, 2V/3, and V, where V is the supply voltage. Upon receiving an input signal value of 1 at input 602, data level controller 512 initially drives the data write line an initial voltage so as to provide for a voltage drop across storage transistor 302 of V/3. If the sense amplifier output signal is higher than V/3 (due for example to memory cell variations or the resistance of read transistor 306 ), data level controller 512 adjusts the voltage on the data write line to reduce the voltage drop across storage transistor 302 until the sense amplifier output signal equals V/3. Data level controller 512 may also adjust the data write line voltage in the opposite direction when the sense amplifier output signal is lower than V/3.

Memory circuit 500 advantageously accommodates the storage of more than two logic states in a memory cell. The feedback implementation adjusts the stored charge of memory cell 210 in order to ensure an accurate retrieval of the logic state. Accurate retrieval of logic states is essential to the reliability of any multi-level logic storage method using DRAMs, since the increased number of logic states reduces the margin for error.

Numerous variations and modifications will become apparent to those skilled in the art once the above disclosure is fully appreciated. It is intended that the following claims be interpreted to embrace all such variations and modifications.

What is claimed is:

1. A memory circuit comprising:
    a memory cell which includes:
        a storage transistor with a first terminal, a second terminal, and a gate, said first terminal coupled to a predetermined voltage;
        a read transistor coupled to said second terminal, said read transistor configured to conduct a current through said storage transistor when a read signal is asserted; and
        a write transistor coupled to said gate, said write transistor configured to store a charge on said gate of said storage transistor when a write signal is asserted; and
    an analog-to-digital converter coupled to detect a value indicative of a voltage across said storage transistor, wherein said analog to digital converter is configured to convert said value to one of at least three distinct digital values.

2. The memory circuit of claim 1, wherein said analog-to-digital converter comprises a plurality of comparators, each coupled to compare said input voltage to one of a plurality of reference voltages.

3. The memory circuit of claim 1, further comprising a data line driver coupled to receive one of said distinct digital values, said data line driver configured to responsively provide a write voltage to said write transistor.

4. The memory circuit of claim 1, further comprising a data level controller coupled to receive one of said distinct digital values, said data level controller is configured to receive said input voltage as a feedback signal and, in accordance with said distinct digital value, to adjust said write voltage to cause said feedback signal to converge upon a predetermined value.

5. The memory circuit of claim 3, wherein said write voltage is one of a set of equally spaced voltage levels which correspond to said distinct digital values.

6. The memory circuit of claim 4 wherein said desired voltage is one of a set of equally spaced voltage levels which correspond to said distinct digital values.

7. The memory circuit of claim 1, further comprising an address decoder configured to assert said read signal in response to receiving an address signal and an enable signal.

8. The memory circuit of claim 1, further comprising a bi-directional gate configured to convert n binary data bits into m logic signals during a write operation, wherein each of said logic signals has one of said distinct digital values, said bi-directional gate further configured to convert m logic signals, each having one of said distinct digital values, into n binary data bits during a read operation.

9. The memory circuit of claim 1, further comprising a sense amplifier coupled to detect said current through said storage transistor, said sense amplifier configured to responsively provide said input voltage.

10. The memory circuit of claim 1, wherein said analog to digital converter is configured to convert said value to one of three distinct digital values.

11. The memory circuit of claim 1, wherein said analog to digital converter is configured to convert said value to one of four distinct digital values.

12. A memory circuit comprising:
  an address decoder configured to assert a word read signal in response to receiving an address signal, a read signal, and an enable signal, said address decoder further configured to assert a word write signal in response to said address signal, a write signal, and said enable signal;
  a bi-directional gate configured to convert n binary data bits into m logic signals during a write operation, wherein each of said logic signals has one of a number of distinct digital values, said number is at least three, said bi-directional gate further configured to convert m logic signals, each having one of said distinct digital values, into n binary data bits during a read operation;
  a memory cell which includes:
    a storage transistor with a first terminal, a second terminal, and a gate, said first terminal coupled to a predetermined voltage;
    a read transistor coupled to said second terminal, said read transistor configured to conduct a current through said storage transistor when said word read signal is asserted; and
    a write transistor coupled to said gate, said write transistor configured to store a charge on said gate of said storage transistor when said word write signal is asserted;
  a data line driver coupled to receive one of said number of distinct digital values, said data line driver configured to responsively provide a write voltage to said write transistor;
  a sense amplifier coupled to detect a voltage indicative of said current through said storage transistor, said sense amplifier configured to responsively provide an input voltage; and
  an analog-to-digital converter coupled to detect said input voltage indicative of a voltage across said storage transistor, wherein said analog to digital converter is configured to convert said input voltage to one of at least three distinct digital values.

13. The memory circuit of claim 12, wherein said analog-to-digital converter comprises a number of comparators, each coupled to compare said input voltage to one of a number of reference voltages, wherein said number of comparators equals said number of reference voltages, and wherein said number of reference voltages is equal to one less than said number of distinct digital values.

14. The memory circuit of claim 12, wherein said data line driver is further coupled to receive said input voltage, said data line driver is configured to adjust said write voltage to cause said input voltage to converge to a desired voltage.

15. A computer system comprising:
  a CPU coupled to communicate address and data information on a bus; and
  a memory circuit coupled to store and retrieve said data information, said memory circuit includes:
    an address decoder configured to assert a word read signal in response to receiving an address signal, a read signal, and an enable signal, said address decoder further configured to assert a word write signal in response to said address signal, a write signal, and said enable signal;
    a bi-directional gate configured to convert n binary data bits into m logic signals during a write operation, wherein each of said logic signals has one of a number of distinct digital values, said number is at least three, said bi-directional gate further configured to convert m logic signals, each having one of said distinct digital values, into n binary data bits during a read operation;
    a memory cell which includes:
      a storage transistor with a first terminal, a second terminal, and a gate, said first terminal coupled to a known voltage;
      a read transistor coupled to said second terminal, said read transistor configured to conduct a current through said storage transistor when said word read signal is asserted; and
      a write transistor coupled to said gate, said write transistor configured to store a charge on said gate of said storage transistor when said word write signal is asserted;
    a data line driver coupled to receive one of said number of distinct digital values, said data line driver configured to responsively provide a write voltage to said write transistor;
    a sense amplifier coupled to detect a voltage indicative of said current through said storage transistor, said sense amplifier configured to responsively provide an input voltage; and
    an analog-to-digital converter coupled to detect said input voltage and configured to convert said value to one of at least three distinct digital values.

16. The computer system of claim 15, wherein said analog-to-digital converter comprises a number of comparators, each coupled to compare said input voltage to one of a number of reference voltages, wherein said number of comparators equals said number of reference voltages, and wherein said number of reference voltages is equal to one less than said number of distinct digital values.

17. The computer system of claim 15, wherein said data line driver is further coupled to receive said input voltage, said data line driver is configured to adjust said write voltage to cause said input voltage to converge to a desired voltage.

18. The computer system of claim 15, wherein said number of distinct digital values is five.

* * * * *